(12) United States Patent
Akimoto et al.

(10) Patent No.: US 6,197,372 B1
(45) Date of Patent: Mar. 6, 2001

(54) COATING AND DEVELOPING APPARATUS, COMPLEX APPARATUS AND PROCESSING METHOD IN COATING AND DEVELOPING APPARATUS

(75) Inventors: Masami Akimoto; Issei Ueda, both of Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/124,009

(22) Filed: Jul. 29, 1998

(30) Foreign Application Priority Data

Aug. 6, 1997 (JP) .................................... 9-224305

(51) Int. Cl.$^7$ .............................. B05C 13/02; B05D 3/12
(52) U.S. Cl. ......................... 427/240; 427/425; 118/52; 118/320; 118/500; 118/698; 414/940
(58) Field of Search ..................... 118/320, 305, 118/52, 698, 500, 503; 427/240, 425; 414/940; 438/782, 973

(56) References Cited

U.S. PATENT DOCUMENTS

| | | | |
|---|---|---|---|
| 5,553,994 | * | 9/1996 | Biche et al. .......................... 414/752 |
| 5,625,433 | * | 4/1997 | Inada et al. ........................... 396/604 |
| 5,826,129 | | 10/1998 | Hasebe et al. . |
| 5,905,850 | * | 5/1999 | Kaveh ...................................... 396/94 |
| 5,923,915 | * | 7/1999 | Akimoto et al. ...................... 396/604 |
| 5,942,013 | * | 8/1999 | Akimoto ............................... 29/25.01 |
| 5,972,110 | * | 10/1999 | Akimoto ................................ 118/52 |

FOREIGN PATENT DOCUMENTS 7-297258   11/1995  (JP) .

* cited by examiner

Primary Examiner—Shrive Beck
Assistant Examiner—Jennifer Calcagni
(74) Attorney, Agent, or Firm—Oblon, Spivak, McClelland, Maier & Neustadt, P.C.

(57) ABSTRACT

A coating and developing apparatus comprises a processing unit group having a plurality of processing units including a complex unit in which a first mounting stand mounting a substrate and a second mounting stand mounting and cooling the substrate are stacked. A plurality of processing units individually perform processes necessary for coating and developing the substrate. A plurality of processing units are multi-tiered. First, a substrate is carried from a substrate storing member which stores a plurality of substrates to the first mounting stand. Next, the substrate is carried out from the first mounting stand to be coated and developed. Thereafter, the coated and developed substrate is carried to the second mounting stand, from which the substrate is carried into the substrate storing member.

10 Claims, 7 Drawing Sheets

COATING AND DEVELOPING APPARATUS, COMPLEX APPARATUS AND PROCESSING METHOD IN COATING AND DEVELOPING APPARATUS

BACKGROUND OF THE INVENTION

The present invention relates to a coating and developing apparatus, for example, for coating a substrate with a resist solution and developing the substrate, a complex apparatus, and a processing method in the coating and developing apparatus.

In a photo-resist process of semiconductor device fabrication, a resist solution is coated on a surface of a substrate such as a semiconductor wafer (referred to as "a wafer" hereinafter) to form a resist film. After the designated pattern is exposed, the substrate is coated with a developing solution and developed. A coating and developing apparatus is used so far in a series of the above processes.

The coating and developing apparatus is provided with processing units which individually perform a series of processes necessary for coating and developing, for example, an adhesion process for improving resist fixing, a coating process for coating a resist solution, a heating process for heating a wafer after being coated with the resist solution to cure a resist film, another heating process for heating an exposed wafer at the designated temperature, a developing process for developing an exposed wafer, a cooling process for cooling a heated wafer to the designated temperature, and the like.

Incidentally, in order to save installation space, recently an integrated coating and developing apparatus in which the above processing units are vertically multi-tiered is being suggested. Provided almost in a center portion of this type of coating and developing apparatus is a main carrier unit with a vertical carrier system for carrying a wafer in/out from each of the above processing units. Around the main carrier unit, the above processing units are disposed to form a process unit called a process station. A cassette which stores wafers is mounted on a mounting unit called a cassette station disposed on one side of the process station. A sub-carrier unit apart from the above main carrier unit is provided to carry a wafer between the mounting unit and the process unit.

When being carried between the cassette station and the process station, a wafer is not directly carried between the main carrier unit and the sub-carrier unit, but the wafer is usually carried through a delivery unit which can be accessed from both the mounting unit side and the process unit side. Specifically, an exclusive unit for delivery is separately provided in multi-tiered processing units. When a wafer is carried, the main carrier unit and the sub-carrier unit respectively mount the wafer to be carried on the exclusive unit for delivery for a time.

In other words, a wafer to be processed is mounted on the exclusive unit for delivery from the side of the cassette station with the sub-carrier unit. Subsequently, the main carrier unit receives the mounted wafer on the exclusive unit from the side of the process station and carries the wafer to the designated processing unit. Thereafter in each processing unit, the designated processing is performed.

Meanwhile, a wafer which completed the designated processing in each processing unit is carried with the main carrier unit to the exclusive unit for delivery where the wafer is mounted for a time. Subsequently, the sub-carrier unit receives the processed wafer mounted on the exclusive unit and thereafter carries it to the side of the cassette station to be stored in the designated cassette.

Multi-tiered processing units, however, are limited in number of tiers from installation space. If an exclusive unit for delivery is provided, the number of other processing units can not be increased by the space thereof.

BRIEF SUMMARY OF THE INVENTION

An object of the present invention is to provide a coating and developing apparatus, a complex apparatus, and a processing method in the coating and developing apparatus, which can increase the number of tiers in multi-tiered processing units and thus improve throughput.

To attain the above object, a coating and developing apparatus in the present invention comprises a first processing unit group having a plurality of processing units including a complex unit in which a first mounting stand mounting a substrate and a second mounting stand mounting and cooling the substrate are stacked, the processing units individually performing processes necessary for coating and developing the substrate, the processing units being multi-tiered, a first carrier unit for carrying the substrate in/out between the processing units, and a second carrier unit for carrying a substrate in/out from the first and second mounting stands in the complex unit.

A complex apparatus in the present invention is provided with a first mounting stand for mounting a substrate, and a second mounting stand stacked integrally with the first mounting stand for mounting and cooling the substrate.

A processing method in the present invention in a coating and developing apparatus comprising a first processing unit group having a plurality of processing units including a complex unit in which a first mounting stand mounting a substrate and a second mounting stand mounting and cooling the substrate are stacked, the processing units individually performing processes necessary for coating and developing the substrate, the processing units being multi-tiered, comprises the steps of carrying a substrate out from a substrate storing portion storing a plurality of substrates to the first mounting stand, carrying the substrate out from the first mounting stand, coating and developing the substrate carried out from the first mounting stand, carrying the coated and developed substrate to the second mounting stand, and carrying the substrate from the second mounting stand into the substrate storing portion.

In the present invention, both delivery and cooling of a substrate can be performed in one complex unit. Therefore, an exclusive unit for delivery of a substrate used so far becomes unnecessary, which makes it possible to allocate the space necessary for disposing the exclusive unit for delivery to another processing unit, for example. As a result, the processing number of substrates can be increased, thus improving throughput.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Certain terminology will be used in the following description for convenience in reference only and will not be limiting. The word "up", "down", "right" and "left" will designate directions in the drawings to which reference is made. The word "in" and "out" will refer to directions toward and away from, respectively, the geometric center of the device and designated parts thereof. Such terminology will include derivatives and words of similar import.

Figure 1:
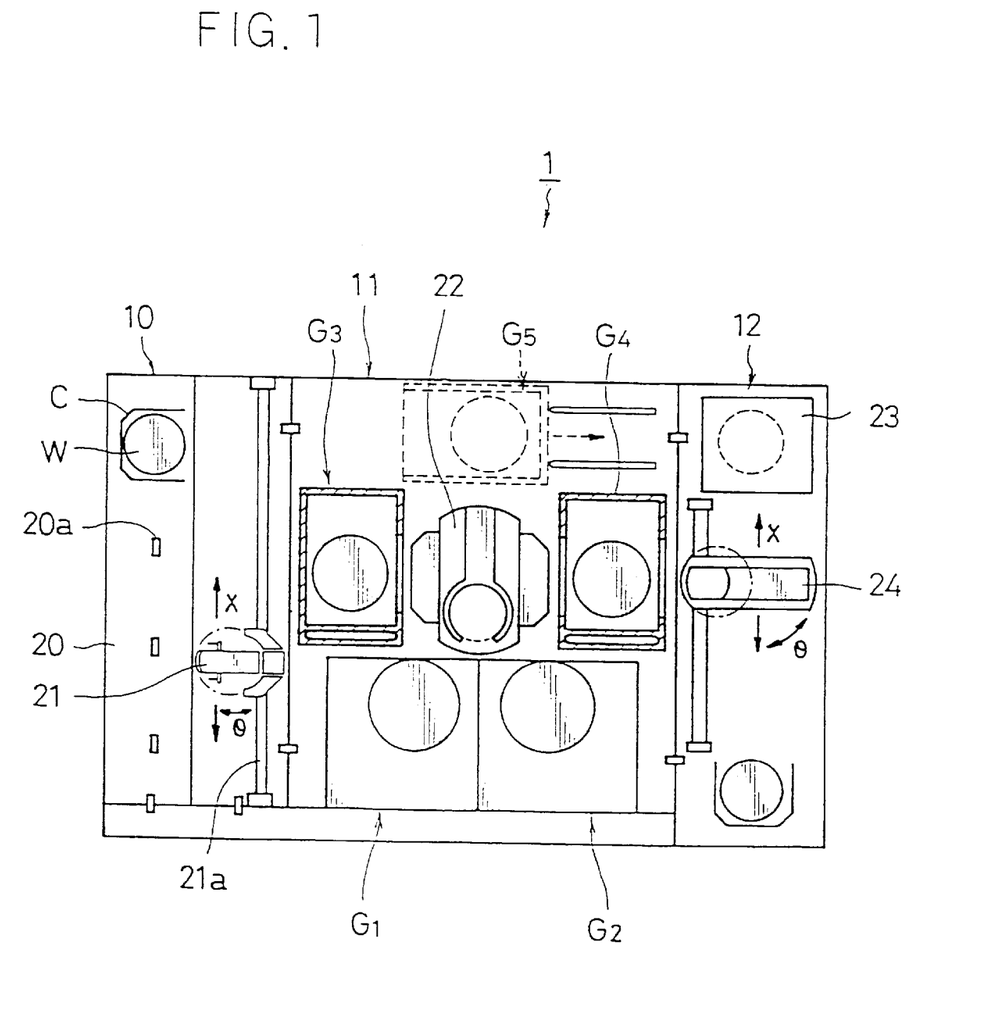
FIG. 1 is a plane view of a coating and developing apparatus according to an embodiment of the present invention.
Figure 2:
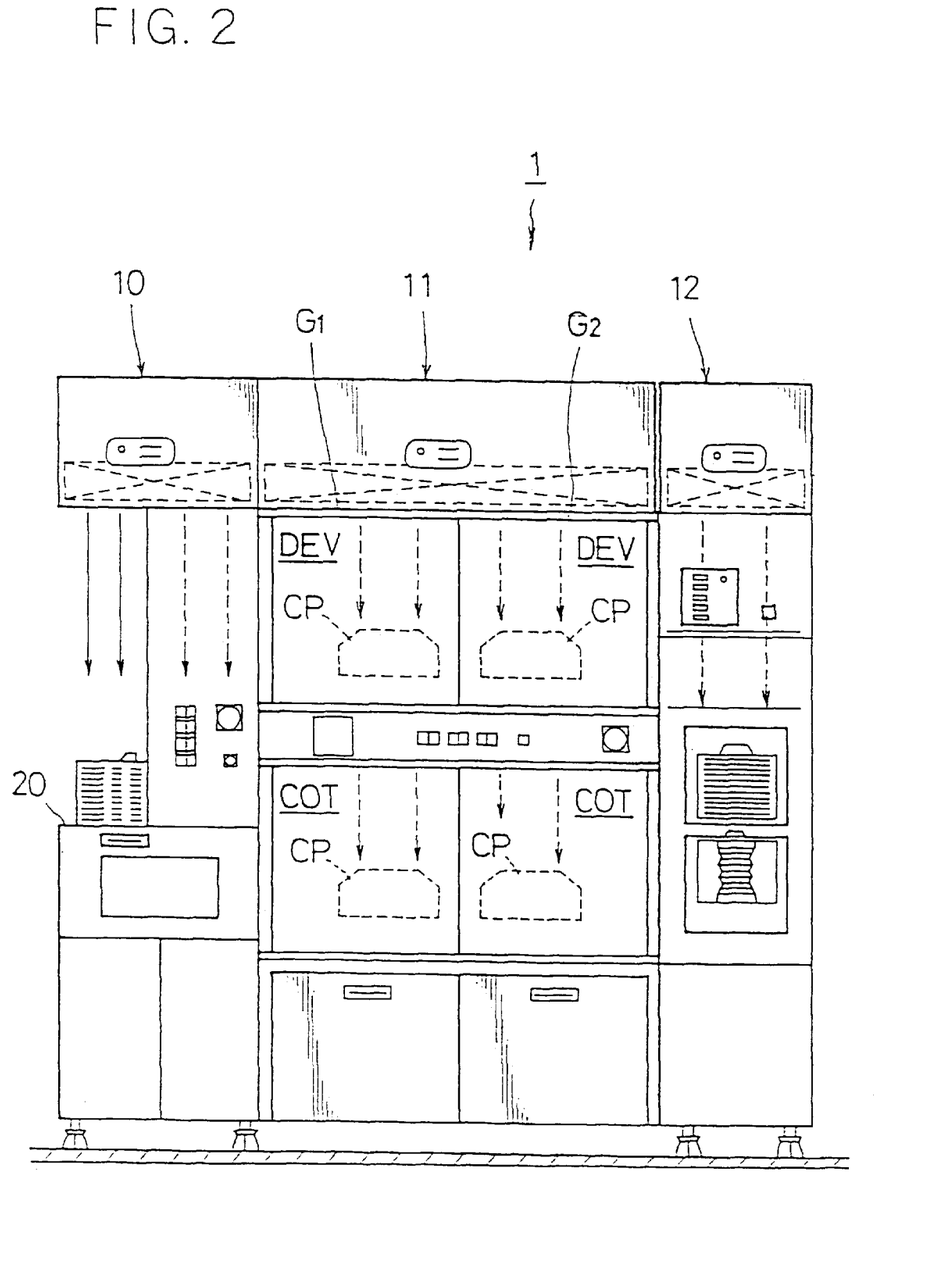
FIG. 2 is a front view of the coating and developing apparatus shown in FIG. 1.
Figure 3:
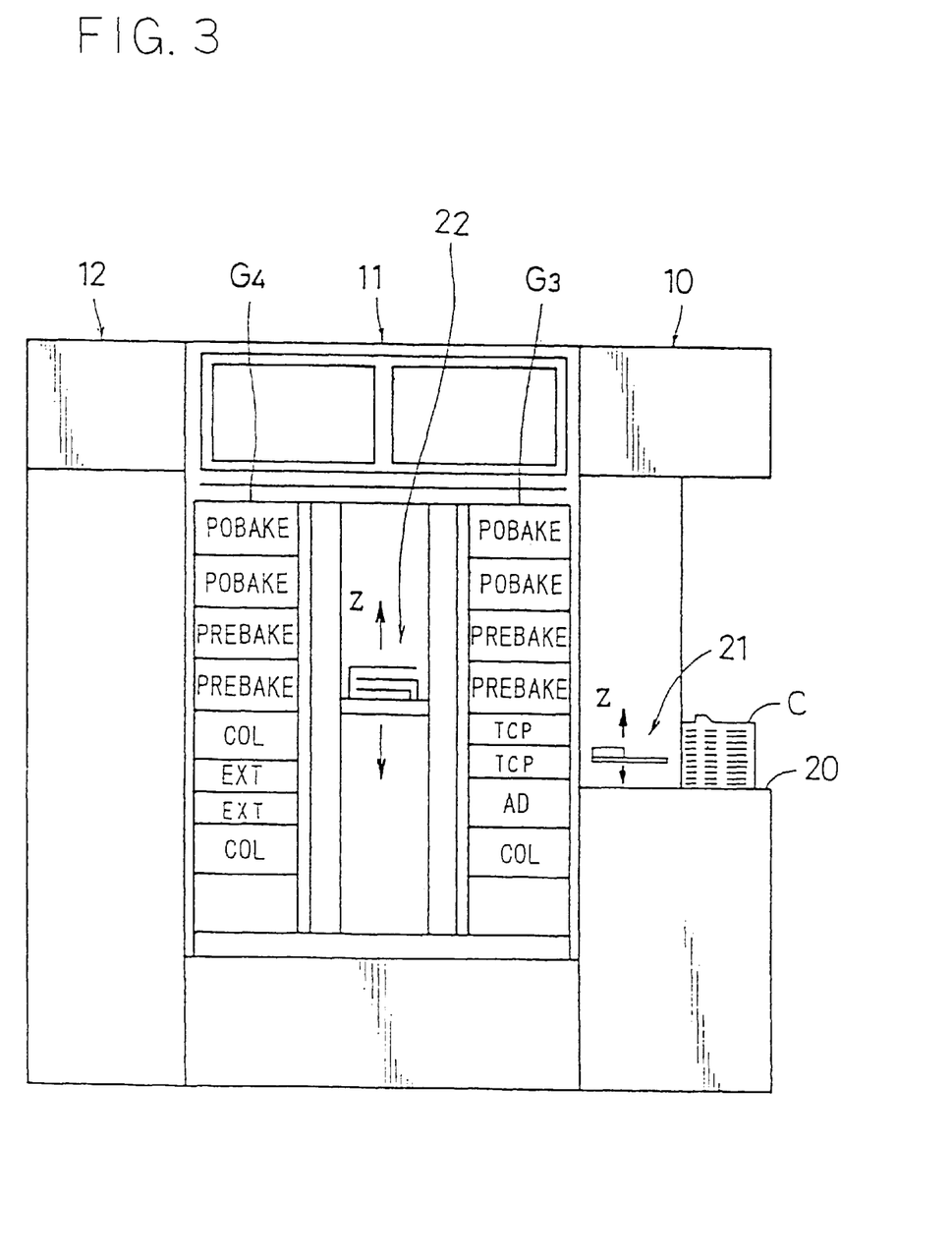
FIG. 3 is a rear view of the coating and developing apparatus shown in FIG. 1.

As shown in FIG. 1 to FIG. 3, a coating and developing system 1 is provided with a cassette station 10 in which more than one wafer W, for example, twenty-five wafers per cassette C are carried in the system from the outside or carried out from the system, and also carried in/out from the cassette C, a process station 11 in which various kinds of processing units are multi-tiered in the designated position and each processing unit gives the predetermined treatment to wafers W one by one in the process of coating and developing, and an interface unit 12 in which the wafer W is sent and received to/from an exposing unit (not shown), all of which are integrally connected.

In the cassette station 10, as shown in FIG. 1, cassettes C, for example, up to four cassettes are disposed respectively with each way in/out for wafers opening to the side of the process station 11 in a line in a X-direction (vertical direction in FIG. 1) at the position of each positioning projection 20a on a cassette stand 20 as a mounting unit. A sub-carrier unit 21, which can move in the direction of disposition of the cassettes C (X-direction) and in the direction of disposition of the wafers W (Z-direction; vertical direction) stored in the cassette C, is movable along a carrier path 21a to be selectively accessible to each cassette C.

The sub-carrier unit 21 is rotatable in a θ-direction and accessible to a complex unit (TCP) which belongs to multi-tiered units of a third processing unit group G3 in the side of the process station 11 as described hereinafter.

In the process station 11, as shown in FIG. 1, a main carrier unit 22 with a vertical carrier system is placed in a center portion thereof. The main carrier unit 22 is provided with holding members, for example, three tweezers for holding the wafer W. Around the main carrier unit 22, various kinds of processing units are multi-tiered to compose processing unit groups. The main carrier unit 22 which is movable vertically and rotatable in a θ direction can carry the wafer W held with the above three tweezers in/out from each of processing unit groups G1 to G5 described later.

In the above coating and developing system 1, five processing unit groups G1, G2, G3, G4 and G5 can be disposed. A first and a second processing unit groups G1 and G2 can be disposed in the front side of the system, the third processing unit group G3 can be disposed adjacent to the cassette station 10, a fourth processing unit group G4 can be disposed adjacent to the interface unit 12, and a fifth processing unit group G5 shown in a broken line can be disposed in the back side.

In the first processing unit group G1, as shown in FIG. 2, two spinner-type processing units which put the wafer W on a spin chuck in a cup CP to perform the predetermined processing, for example, a resist solution coating unit (COT) and a developing unit (DEV) are dual stacked in order from the bottom. In the second processing unit group G2 similarly to the first processing unit group G1, two spinner-type processing units, for example, a resist solution coating unit (COT) and a developing unit (DEV) are dual stacked in order from the bottom.

In the third processing unit group G3, as shown in FIG. 3, oven-type processing units in which the wafer W is mounted on a mounting stand (not shown) to perform the predetermined processing, for example, a cooling unit (COL) for cooling, an adhesion unit (AD) for adhesion processing to improve fixing of the resist, a prebaking unit (PREBAKE) for heating before coating, a postbaking unit (POBAKE), and a complex unit (TCP) are all together, for instance, eight-tiered.

The above various kinds of processing units can be rearranged in each processing unit group so as to perform desired wafer processing. For example, the prebaking unit (PREBAKE), the postbaking unit (POBAKE) and the adhesion unit (AD), all of three requiring high processing temperature, are disposed above, and the cooling unit (COL), the above complex unit (TCP) or the like, those requiring low processing temperature, are disposed below, thereby reducing thermal mutual interference between units.

As shown in FIG. 1 and FIG. 2, a peripheral exposing unit 23 is disposed in the back side of the interface unit 12 and a wafer carrier 24 is disposed in the center portion thereof. The wafer carrier 24 moves in a X-direction and in a Z-direction (vertical direction) and also rotates in a θ-direction to be accessible to the peripheral exposing unit 23, an extension unit (EXT) which belongs to the fourth processing unit group G4 in the side of the process station 11, and moreover to a wafer delivery stand (not shown) in the side of the adjacent exposing unit (not shown) where a pattern is exposed.

Figure 4:
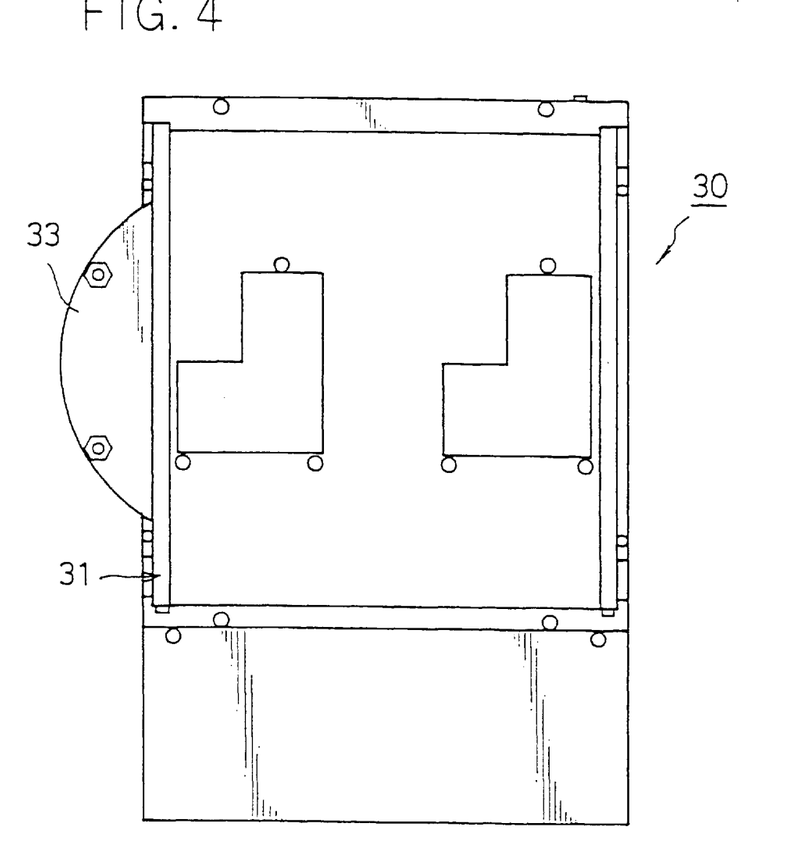
FIG. 4 is a plane view of a complex unit used in the coating and developing unit shown in FIG. 1.
Figure 5:
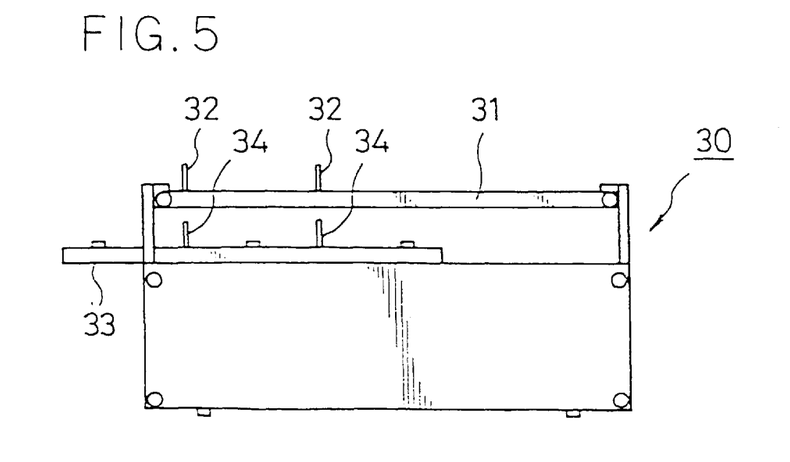
FIG. 5 is a side elevational view of the complex unit shown in FIG. 4.
Figure 6:
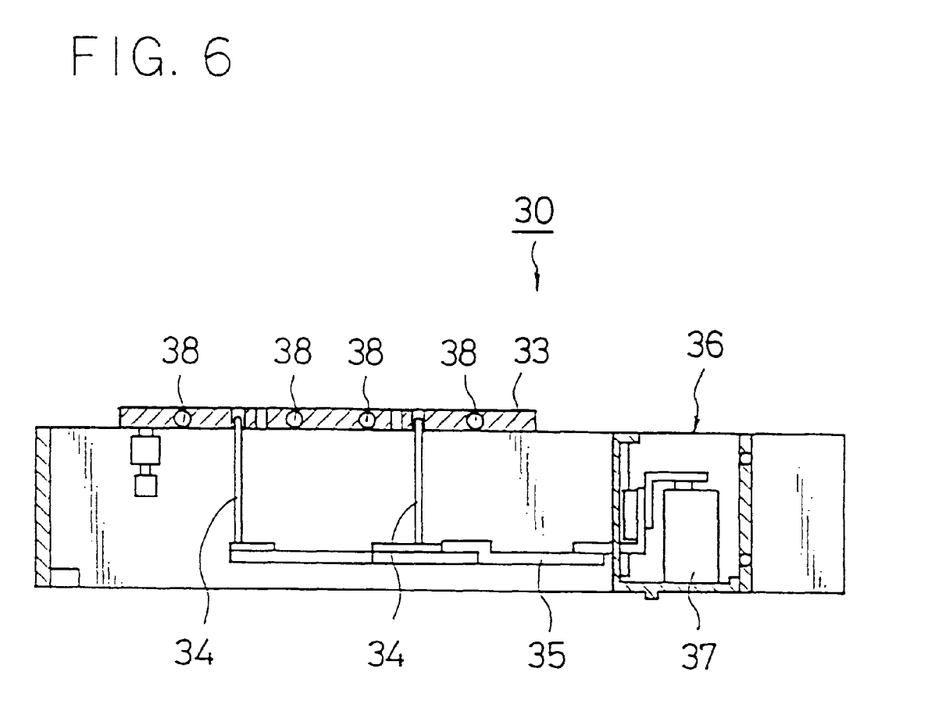
FIG. 6 is a front view of the complex unit shown in FIG. 4.

A plane view, a side elevational view, and a front view of the above complex unit (TCP) are shown in FIG. 4 to FIG. 6, respectively. In FIG. 6, however, a mounting stand 31 and supporting pins 32, both described later, are omitted for explanatory reasons.

As shown in FIG. 4 and FIG. 5, formed in an upper portion of the complex unit (TCP) is the mounting stand 31 on which plural supporting pins 32 for holding the wafer W are fixed.

Disposed under the mounting stand 31 in the above complex unit (TCP) is a cooling mounting stand 33 parallel to the mounting stand 31. As shown in FIG. 6, provided in the cooling mounting stand 33 are plural supporting pins 34 for holding the wafer W, which freely strike out from and retract in the cooling mounting stand 33. The supporting pins 34 are connected to an arm 35 for ascent and descent disposed below. The arm 35 for ascent and descent moves vertically by drive of a cylinder 37 in a driving unit 36 disposed on one side of the complex unit (TCP).

The cooling mounting stand 33 is formed of aluminum, for example. A cooling water pipe 38 is provided within the cooling mounting stand 33. Accordingly, the circulation of cooling water through the cooling water pipe 38 makes it possible to cool the cooling water mounting stand 33 and cool the wafer W mounted on the cooling water mounting stand 33 to the designated temperature.

Figure 7:
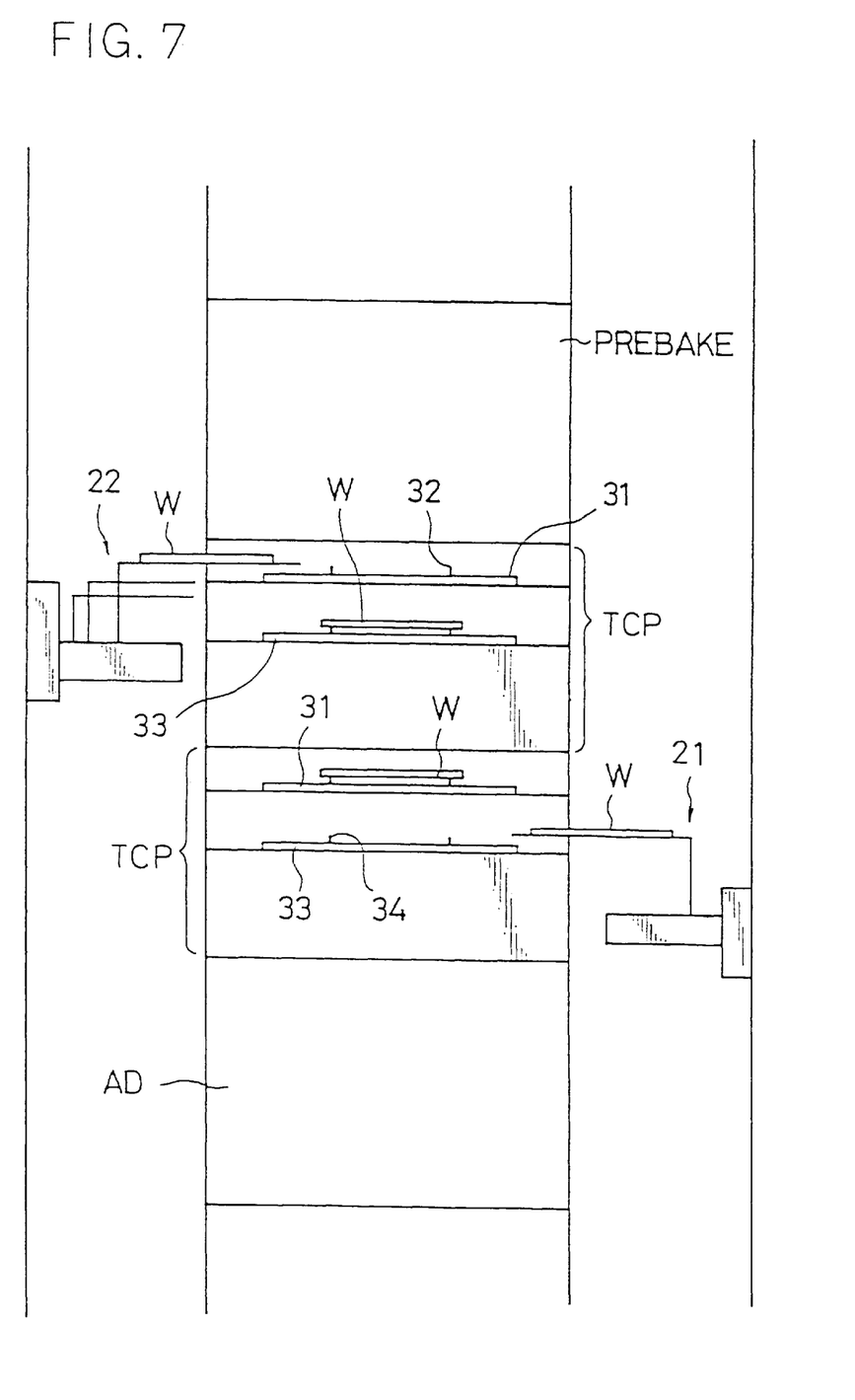
FIG. 7 is an explanatory view of operation with the complex unit shown in FIG. 4 as the center thereof.

The coating and developing apparatus 1 according to this embodiment is structured as described above. Next, the operation and effects thereof will be described. The wafer W to be coated and developed is taken from the cassette C with the sub-carrier unit 21, and mounted on the supporting pins 32 on the mounting stand 31 in the upper side of the complex unit (TCP), first. Then, as shown in FIG. 7, the main carrier unit 22 receives the wafer W and carries it in the adhesion unit (AD). Thereafter, in accordance with the predetermined recipe, the wafer W is given exposing treatment of the pattern in the exposing unit (not shown) by way of the cooling unit (COL), the resist solution coating unit (COT), the peripheral exposing unit, or the like.

Subsequently, after being developed in the developing unit (DEV), the wafer W is heat-treated in the postbaking unit (POBAKE) and then mounted on the supporting pins 34 on the cooling mounting stand 33 in the lower side of the complex unit (TCP) with the main carrier unit 22.

After the wafer W is mounted on the cooling mounting stand 33 with the descent of the supporting pins 34, the wafer W is cooled to the designated temperature, for example, to 25° C. After the cooling process is completed, the supporting pins 34 ascend and stand by. Subsequently, the sub-carrier unit 21 receives the wafer W on the supporting pins 34 on the cooling mounting stand 33 and carries the wafer W into the designated cassette C.

As described above, in the complex unit (TCP) in the coating and developing apparatus 1 according to this embodiment, delivery for carrying the unprocessed wafer W in the process station 11 and cooling process after heat-treating the wafer W in the postbaking unit (POBAKE) can be performed in one unit. Therefore, an exclusive unit for delivery of the wafer W used so far becomes unnecessary, which makes it possible to allocate the space necessary for disposing the exclusive unit for delivery in the processing unit group to another processing unit, for example, in consideration of adjustment of each processing time. As a result, the processing number of wafers W can be increased.

Disposed on one side of the cooling mounting stand 33 is a driving unit 36 necessary for raising and lowering the supporting pins 34 on the cooling mounting stand 33. Therefore, the height in a vertical direction of the complex unit (TCP) can be reduced by the height of the driving unit 36. Consequently, the height of the complex unit (TCP) itself can be reduced, thereby increasing the number of tiers of the processing units multi-tiered in the processing unit group. In addition, since the mounting stand 31 is required to function only as a delivery unit of the wafer W, a drive system for raising and lowering the supporting pins 32 is unnecessary.

Concerning the vertical relationship between the mounting stand 31 and the cooling mounting stand 33 in the complex unit (TCP), both of them can be disposed above or below. But, if the heavy cooling mounting stand 33 rather than the light mounting stand 31 is disposed below, the weight balance of the complex unit (TCP) itself is improved and stabilized. Besides, the above disposition that the cooling mounting stand 33 with lower temperature in comparison with the mounting stand 31 is disposed below can prevent thermal interference caused between the mounting stand 31 and the cooling mounting stand 33.

Figure 8:
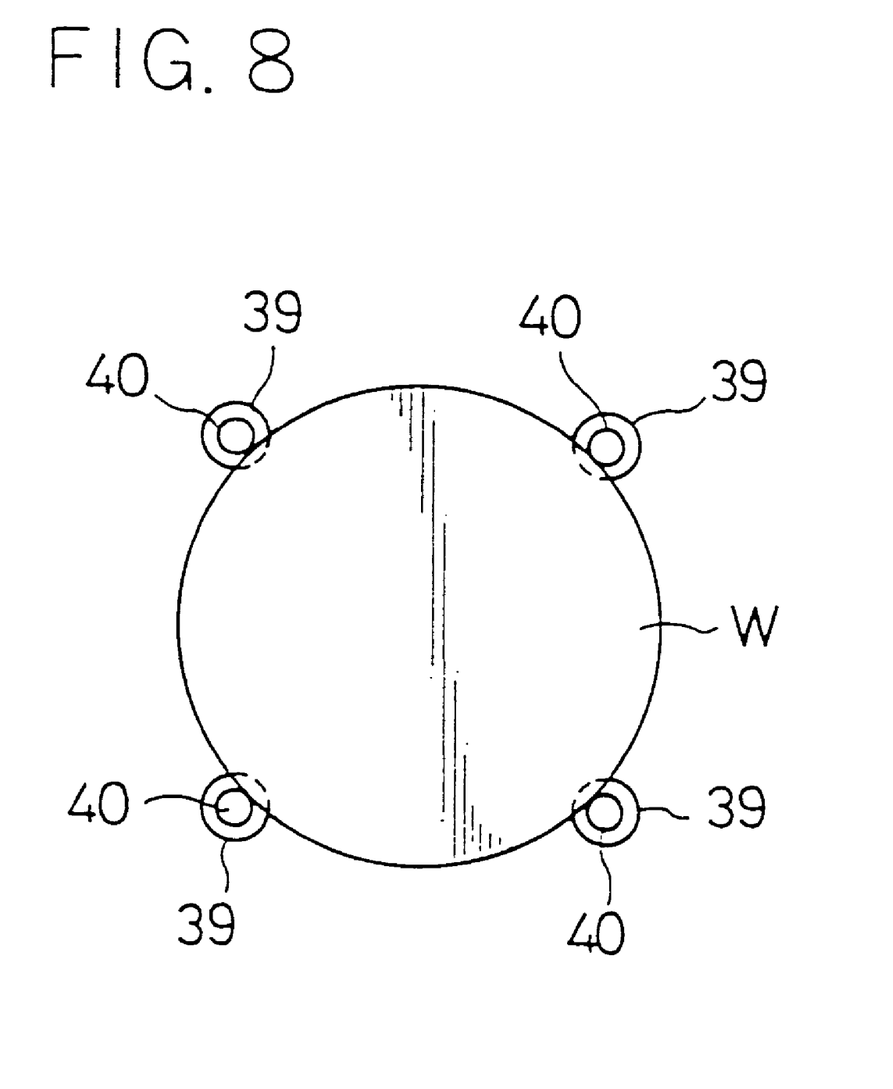
FIG. 8 is a schematic plane view of a cooling mounting stand according to another embodiment of the present invention.

The complex unit (TCP) can be provided with an alignment mechanism of the wafer W in any one of the mounting stand 31 or the cooling mounting stand 33, when reproducibility is not recognized in alignment accuracy of the wafer W in the sub-carrier unit 21 or the main carrier unit 22, for example. FIG. 8 shows an example of an alignment mechanism disposed on the cooling mounting stand 33. Four spacers 39 are disposed on a peripheral portion of the upper surface of the cooling mounting stand 33. Positioning members 40 are attached on the spacers 39, respectively. Each positioning member 40 together with the spacer 39 is screwed down on the cooling mounting stand 33. The inner peripheral surface of the positioning member 40 is tapered. When being lowered on the cooling mounting stand 33, the wafer W is guided along the tapered inner peripheral surface while the outer peripheral portion thereof is touching the positioning member 40 so as to settle in a stable position by its own weight. As a result, the wafer W is positioned. In this case, an alignment mechanism for the wafer W such as an exclusive alignment unit (ALIM) becomes unnecessary. Thus, the space necessary for disposing the above alignment unit (ALIM) can be allocated to another processing unit.

In the above embodiment, the wafer W is cooled by the cooling mounting stand 33. When cooling of the wafer W is unnecessary, the cooling mounting stand 33 may function only as a mounting stand for the wafer W without letting cooling water flow through the cooling water pipe 38 in the cooling mounting stand 33. The above embodiment is described with the wafer W as a substrate, but the present invention is not limited to the above embodiment, and also applicable to another embodiment in which a LCD substrate is used.

As described above, according to the present embodiment, both delivery and cooling of a substrate can be performed in one complex unit, which makes it possible to increase the number of other processing units. Consequently the processing number of substrates per hour can be increased.

In addition, according to the present embodiment, a heavy cooling mounting stand is disposed below, thus stabilizing the weight balance of a complex unit and preventing thermal interference caused between a mounting stand and the cooling mounting stand.

Moreover, according to the present embodiment, it is unnecessary to provide an excess mechanism for raising and lowering supporting pins disposed on a mounting stand. Naturally, on a cooling mounting stand, supporting pins which can freely ascend and descend are provided so that a substrate can be cooled while being mounted on the cooling mounting stand.

Furthermore, according to the present embodiment, a driving source for driving supporting pins on a cooling mounting stand is disposed on one side of the cooling mounting stand, which makes it possible to reduce the height of a complex unit. Accordingly, the number of tiers composed of each processing unit in the processing unit group can be increased.

Still more, according to the present embodiment, an alignment mechanism is provided at least in any one of a mounting stand or a cooling mounting stand so that alignment of a wafer is possible, if necessary. It becomes unnecessary to provide an exclusive mechanism for alignment as one processing unit in a conventional processing unit group.

The above-described embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A coating and developing apparatus for processing substrates one by one using photolithography, comprising:

a cassette station in/from which a cassette is carried;

a first group having a plurality of first processing units configured to process the substrate;

a second group having a plurality of second processing units configured to process the substrate;

a sub-carrier unit configured to carry the substrate from/in the cassette of the cassette station, to carry the substrate from/in each of said first processing units, and to carry the substrate between said cassette station and each of said first processing units;

a main carrier unit configured to carry the substrate from/in each of said first processing units, to carry the substrate from/in each of said second processing units, and to carry the substrate between each of said first processing units and each of said second processing units;

a complex unit included in the first group and having two ports configured to carry in/out the substrate, one of the ports being opened to said sub-carrier unit, and the other port being opened to said main carrier unit;

a first mounting stand provided in said complex unit and mounted with the substrate; and a second mounting stand provided in said complex unit such that said first mounting stand and said second mounting stand are formed one on another, said second mounting stand being mounted with the substrate and cooled.

2. The apparatus as set forth in claim 1, wherein said first group is arranged between said sub-carrier unit and said main carrier unit.

3. The apparatus as set forth in claim 1, wherein said first mounting stand is disposed in an upper portion of said complex unit; and said second mounting stand is disposed in a lower portion of said complex unit.

4. The apparatus as set forth in claim 1, wherein said first mounting stand includes first supporting pins configured to directly support the substrate; and said second mounting stand includes second supporting pins configured to directly support the substrate and free to project from a mounting surface of said second mounting stand, and a driving unit configured to raise and lower said second supporting pins.

5. The apparatus as set forth in claim 1, wherein one of said first and second mounting stands includes an alignment mechanism configured to align the mounted substrate.

6. The apparatus as set forth in claim 1, wherein said second mounting stand includes a cooling water pipe buried under the mounting surface through which a cooling water flows.

7. The apparatus as set forth in claim 1, wherein said second processing unit group includes a coating unit configured to coat the substrate with a resist solution.

8. The apparatus as set forth in claim 1, wherein said second group includes a developing unit configured to develop the substrate.

9. The apparatus as set forth in claim 1, wherein said first group includes a thermal processing unit configured to heat the substrate; and said complex unit is disposed below said thermal processing unit.

10. A method of processing substrates one by one using an apparatus comprising a cassette station in/from which a cassette is carried, a first group having a plurality of first processing units configured to process the substrate, a second group having a plurality of second processing units configured to the substrate, a sub-carrier unit configured to carry the substrate from/in the cassette of the cassette station, to carry the substrate from/in each of said first processing units, and to carry the substrate between said cassette station and each of said first processing units, a main carrier unit configured to carry the substrate from/in each of said first processing units, to carry the substrate from/in each of said second processing units, and to carry the substrate between each of said first processing units and each of said second processing units, a complex unit included in the first group and having two ports configured to carry in/out the substrate, one of the ports being opened to said sub-carrier unit and the other port being opened to said main carrier unit, a first mounting stand provided in said complex unit and mounted with the substrate, and a second mounting stand provided in said complex unit such that said first mounting stand and said second mounting stand are stacked with one on another, said second mounting stand being mounted with the substrate and cooled, said method comprising the steps of:

(a) taking the substrate out of the cassette of said cassette station by said sub-carrier unit, carrying the substrate to said complex unit, and mounting the substrate on said first mounting stand;

(b) taking the substrate out of said first mounting stand by said main carrier unit, carrying the substrate out of said complex unit, and carrying the substrate to said second group;

(c) coating the substrate with resist and developing a resist-coated substrate;

(d) heating the substrate;

(e) carrying the substrate to said complex unit by said main carrier unit, mounting the substrate on said second mounting stand, and cooling the substrate; and (f) taking the substrate out of said second mounting stand by said sub-carrier unit, carrying the substrate out of said complex unit, and carrying the substrate in the cassette of said cassette station.

* * * * *